United States Patent [19]

Seevinck et al.

[11] Patent Number: 4,628,280

[45] Date of Patent: Dec. 9, 1986

[54] AMPLIFIER ARRANGEMENT

[75] Inventors: Evert Seevinck, Delden; Roelof F. Wassenaar, Enschede, both of Netherlands

[73] Assignee: U.S. Philips Corporation, New York, N.Y.

[21] Appl. No.: 764,142

[22] Filed: Aug. 9, 1985

[30] Foreign Application Priority Data

Aug. 20, 1984 [NL] Netherlands .................. 8402541

[51] Int. Cl.$^4$ ............................................. H03F 3/45
[52] U.S. Cl. ................................... 330/259; 330/252; 330/261
[58] Field of Search ............... 330/85, 253, 252, 260, 330/259, 261

[56] References Cited

FOREIGN PATENT DOCUMENTS 3028953 3/1982 Fed. Rep. of Germany ...... 330/253

*Primary Examiner*—Gene Wan
*Attorney, Agent, or Firm*—Robert T. Mayer; Bernard Franzblau

[57] ABSTRACT

An amplifier that supplies a bias current ($I_t$) which is dependent on an input signal ($V_i$) to a junction point (2) of the source electrodes of first and second transistors ($T_1$, $T_2$). The amplifier comprises a control circuit that limits the bias current so it cannot increase more than is necessary to obtain a high slew rate, thereby minimizing dissipation by the amplifier. This control circuit comprises a third and a fourth transistor ($T_3$, $T_4$) arranged in parallel with the first transistor ($T_1$) and the second transistor ($T_2$), respectively, and which carry currents ($I_3$, $I_4$) which are proportional to the currents ($I_1$, $I_2$) in the first and the second transistor. A selection circuit (5) applies the smaller of the two currents ($I_3$, $I_4$) in the third and the fourth transistor to an output (8) where this current is compared with a reference current ($I_o$) from a current source (9). The difference between these currents is applied to a current amplifier (10), which supplies an increasing bias current ($I_t$) until the smaller of the two currents ($I_3$, $I_4$) in the third and the fourth transistor equals the reference current.

15 Claims, 3 Drawing Figures

AMPLIFIER ARRANGEMENT

BACKGROUND OF THE INVENTION

This invention relates to an amplifier arrangement comprising:

a first transistor and a second transistor which are of the same conductivity type and which each comprise a control terminal for receiving an input signal, a first main terminal, and a second main terminal, the first main terminals being coupled to a common terminal, and means for applying a bias current which depends on the input signal to the common terminal, which means comprise a third transistor and a fourth transistor, which each comprise a control terminal and a first and a second main terminal, the currents in the third and fourth transistors being indicative of the currents in the first transistor and in the second transistor, respectively.

In the present description and the appended claims, the first main terminal and the second main terminal are the source electrode and the drain electrode, respectively, in the case of unipolar transistors and the emitter and the collector, respectively, in the case of bipolar transistors.

Such a circuit arrangement is suitable for general use in integrated circuits and in particular in switched-capacitor filter circuits.

In integrated circuits it is important to minimize the power dissipation of the amplifier circuitry used therein. This may be accomplished by selecting a small bias current for the amplifier arrangement. However, a small bias current limits the slew rate of the amplifier arrangement. The slew rate is to be understood to mean the maximum rate of change of the output signal in the case of capacitive loading of the amplifier arrangement. This slew rate is proportional to the bias current of the amplifier arrangement. In order to obtain a low power dissipation in combination with a high slew rate, it is known to increase the bias current of the amplifier arrangement as the input signal increases. Such a solution is described inter alia in the article "Adaptive Biasing CMOS Amplifiers", IEEE Journal of Solid-State Circuits, Vol. SC-17, No. 3, June 1982, pp. 522–528. In this article it is proposed to add a signal-dependent current, which is proportional to the absolute value of the difference between the currents in the amplifier transistors, to a small constant bias current. In that circuit arrangement this is achieved by providing positive feedback of the bias current, the amount of feedback depending on the differential output current of the amplifier circuit. However, the bias current is not defined accurately because the positive feedback causes this current to increase to an extent which is higher than necessary. This also leads to an unnecessarily high dissipation. Therefore, the invention aims at providing an amplifier arrangement with a signal-dependent bias current and a very low power dissipation.

SUMMARY OF THE INVENTION

According to the invention an amplifier arrangement of the type defined in the opening paragraph further comprises:

means for generating a control signal which is a measure of the difference between a reference current and the smaller of the currents in the third transistor and the fourth transistor, and negative-feedback means which minimize the control signal from the control-signal generating means by controlling the bias current applied to the common terminal.

The circuit arrangement in accordance with the invention employs negative feedback to control the bias current at any input voltage in such a way that the smaller of the currents in the third transistor and the fourth transistor is made substantially equal to the reference current. It follows that if the input signal increases the larger current continues to increase so that the bias current also continues to increase. The bias current on longer increases to an extent more than is necessary because the smaller of the currents in the third transistor and the fourth transistor is always controlled so as to become substantially equal to the reference current, which may be selected to be very small. This control method can operate very rapidly and accurately with a high loop gain in the negative-feedback loop.

The control terminals of the third transistor and the fourth transistor may be coupled to the control terminals of the first transistor and the second transistor, respectively, and the first main terminals of the third transistor and the fourth transistor are coupled to the common terminal. By arranging the third transistor and the fourth transistor in this way these transistors will receive the same input signal as the first transistor and the second transistor, so that the currents in the third and the fourth transistor will be proportional to the currents in the first transistor and the second transistor. The proportionality factor is determined by the relative geometries of the transistors. If the first transistor and the second transistor are each loaded by a load transistor the inputs of the third transistor and the fourth transistor, in a further embodiment, may be arranged in parallel with respective ones of these load transistors.

The means for generating the control signal may comprise a selection circuit for applying the smaller of the currents in the third transistor and the fourth transistor to an output and a current source for supplying the reference current to the output, the control signal being formed by the difference between the currents applied to the output. The selection circuit may be constructed in different ways. An embodiment comprising a simple and practical selection circuit is characterized in that the selection circuit comprises a fifth transistor, a sixth transistor, a seventh transistor and an eighth transistor which each comprise a control terminal, a first main terminal and a second main terminal. The fifth transistor and the sixth transistor are arranged in series and have their control terminals connected to the control terminal and the first main terminal of the seventh transistor, respectively, which first main terminal is also coupled to the second main terminal of the third transistor. The control terminal and the first main terminal of the eighth transistor are connected to the second main terminal and the first main terminal of the sixth transistor, respectively, which first main terminal is also coupled to the second main terminal of the fourth transistor. The second main terminal of the eighth transistor is connected to the output of the selection circuit.

The negative-feedback means may comprise a current amplifier having an input connected to the output of the selection circuit and an output coupled to the common terminal. The current amplifier can provide a high loop gain in the negative-feedback loop, resulting in a fast and effective negative feedback. The current amplifier may employ any one of the many types of known current amplifiers suitable for use in integrated circuits. A simple and suitable current amplifier may be obtained if the current amplifier comprises a ninth (or further) transistor having a control terminal, a first main terminal and a second main terminal, the control terminal being coupled to the output of the selection circuit, the second main terminal being coupled to the common terminal, and a current source being arranged between the control terminal and the first main terminal.

BRIEF DESCRIPTION OF THE DRAWING

Embodiments of the invention will now be described in more detail, by way of example, with reference to the accompanying drawings, in which.

DESCRIPTION OF THE PREFERRED EMBODIMENTS

Figure 1:
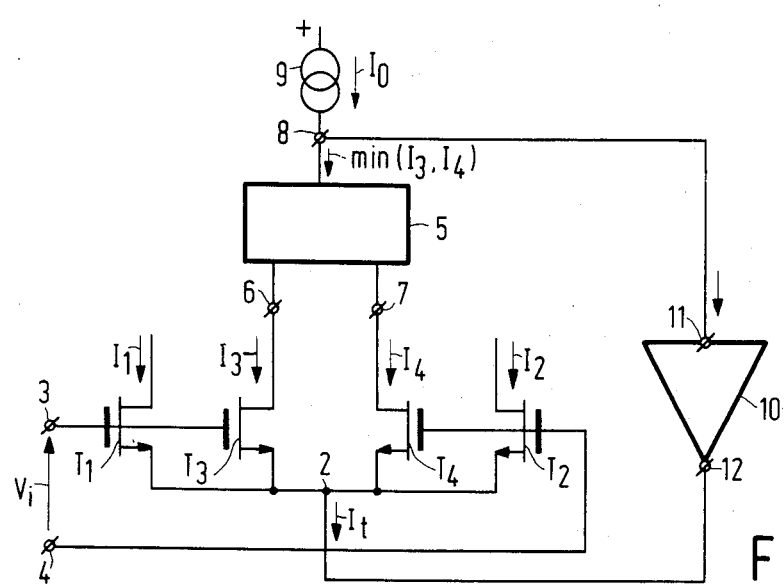
FIG. 1 is a diagram illustrating the principle of a particular amplifier arrangement in accordance with the invention.

FIG. 1 is a diagram illustrating the principle of a particular amplifier arrangement in accordance with the invention. The amplifier arrangement comprises two transistors $T_1$ and $T_2$ arranged as a differential pair and having their source electrodes connected to a common terminal 2 for receiving a bias current $I_t$. An input signal $V_i$ may be applied between the gate electrodes 3 and 4 of the transistors $T_1$ and $T_2$. It is to be noted that instead of a symmetrical drive the amplifier arrangement may be driven asymmetrically. The input signal $V_i$ gives rise to a current $I_1$ in transistor $T_1$ and a current $I_2$ in transistor $T_2$. A transistor $T_3$ is arranged in parallel with transistor $T_1$ and a transistor $T_4$ in parallel with transistor $T_2$. The input voltage $V_i$ therefore also appears between the control electrodes of these transistor so that the ratio between the currents $I_3$ and $I_4$ in the transistors $T_3$ and $T_4$ is equal to the ratio between the currents $I_1$ and $I_2$ in the transistors $T_1$ and $T_2$. The ratio between the currents $I_3$ and $I_1$ and consequently that between $I_4$ and $I_2$ is determined by the relative geometries of the transistors, i.e. the length/width ratios of the channels of the transistors. Generally, this ratio is selected so that the currents $I_3$ and $I_4$ are smaller than the currents $I_1$ and $I_2$. However, alternatively these currents may be equal. The transistors $T_3$ and $T_4$ form part of a circuit which causes the bias current $I_t$ applied to the common terminal 2 to increase when the input signal $V_i$ increases in such a way that the amplifier arrangement provides a high slew rate combined with a very low power dissipation. The currents $I_3$ and $I_4$ from the transistors $T_3$ and $T_4$ are applied to the inputs 6 and 7 of a selection circuit 5 which feeds the smaller of the two currents $I_3$ and $I_4$ to an output 8 of this circuit. Moreover, a reference current $I_o$ supplied by the current source 9 is applied to the output 8. The difference between this reference current $I_o$ and the smaller of the two currents $I_3$ and $T_4$ constitutes a control signal which is applied to the input 11 of a current amplifier 10, at whose output 12 the bias current $I_t$ for the amplifier arrangement appears. The bias current $I_t$ is controlled as a function of the input voltage $V_i$ in the following manner. If no input signal appears between the control terminals 3 and 4 the bias current $I_t$ will be distributed among the transistors $T_1$, $T_2$ and $T_3$, $T_4$ in a ratio which is determined by the ratio between the transistor geometries. The current $I_1$ is then equal to the current $I_2$ and the current $I_3$ is equal to the current $I_4$. In this situation one of the currents $I_3$ and $I_4$ will always appear at the output 8 of the selection circuit 5. If the output current of the selection circuit is, for example, smaller than the reference current $I_o$ from the current source 9, the difference between these currents is applied to the input 11 of the current amplifier 10 as the control current, causing the bias current $I_t$ and hence the currents $I_3$ and $I_4$ to increase. The bias current $I_t$ now increases until the balanced situation is obtained in which the currents $I_3$ and $I_4$ are equal to the reference current $I_o$. This reference current $I_o$ may be very small, so that in the absence of an input signal the currents $I_3$ and $I_4$ and hence the currents $I_1$ and $I_2$ can be very small. If an input signal $V_i$ is applied the current $I_3$, for example, increases and the current $I_4$ decreases. The current $I_4$ appearing at the output 8 of the selection circuit 5 is then smaller than the reference current $I_o$, so that a control current is applied to the current amplifier 10. As a result of this, the bias current $I_t$ increases again until the current $I_4$ has become equal to the reference current $I_o$, so that the control current has been reduced to zero. In this way the smaller of the two currents $I_3$ and $I_4$ is made equal to the reference current $I_o$ when the input signal $V_i$ increases. Owing to the fixed ratio between the currents $I_1$ and $I_3$ and between the currents $I_2$ and $I_4$, the currents $I_1$ and $I_2$ are controlled in the same way. Since the smaller current is always made equal to a fixed current, the increase of the larger of the two currents is also kept under control so that this current does not increase more than is necessary to obtain a high slew rate. This also ensures that the power dissipation of the amplifier arrangement is a minimum.

Figure 2:
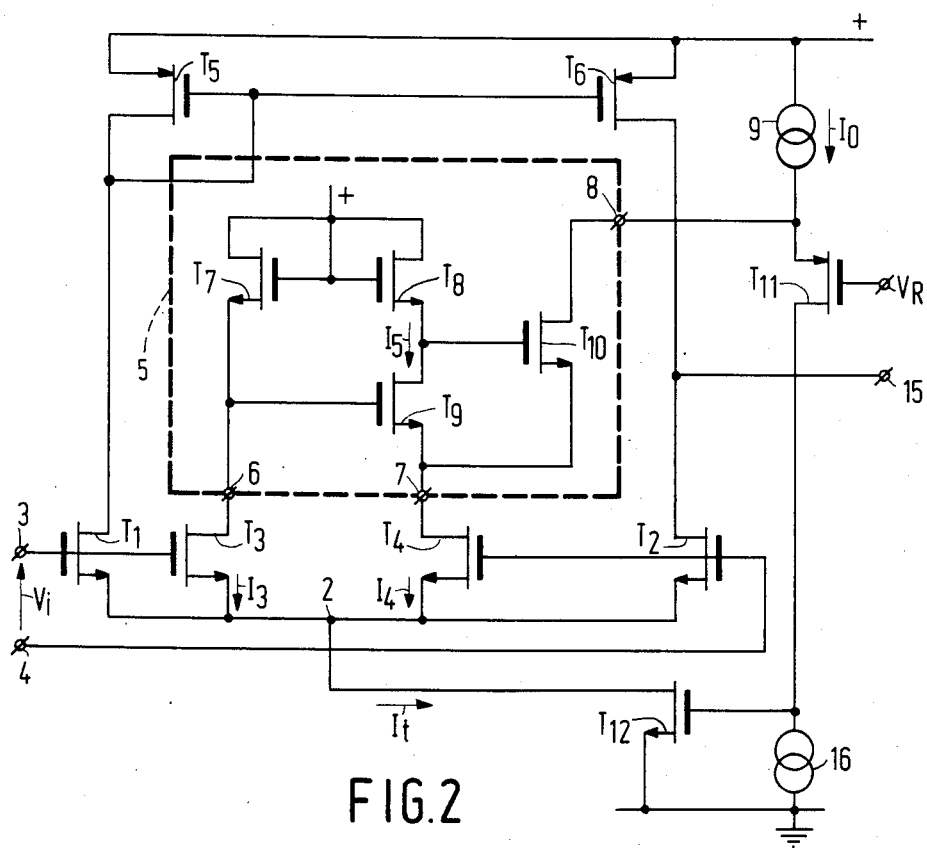
FIG. 2 shows a first embodiment of the invention.

A first embodiment of the invention will now be described in more detail with reference to FIG. 2 in which identical parts bear the same reference numerals as in FIG. 1. The amplifier arrangement is constructed as a transconductance amplifier in that the drain electrode of the transistor $T_1$ is coupled to the drain electrode of transistor $T_2$ by means of a current mirror comprising the transistors $T_5$ and $T_6$, the drain of $T_2$ constituting the output 15 of the arrangement. The difference current of the transistors $T_1$ and $T_2$ appears at this output 15. The selection circuit 5 comprises a transistor $T_7$ whose source electrode is connected to the drain electrode of the transistor $T_3$ and whose gate and drain electrodes are connected to the positive power supply terminal. The source electrode of the transistor $T_7$ is also connected to the gate electrode of a transistor $T_9$, which is arranged in series with a transistor $T_8$. The source electrode of the transistor $T_9$ is connected to the drain electrode of the transistor $T_4$. The gate electrode and the drain electrode of the transistor $T_8$ are connected to the gate electrode and the drain electrode, respectively of the transistor $T_7$. The gate electrode of a transistor $T_{10}$ is connected to the junction point of the drain electrode of the transistor $T_9$ and the source electrode of the transistor $T_8$. The source electrode of said transistor $T_{10}$ is connected to the drain electrode of the transistor $T_4$. The drain electrode of the transistor $T_{10}$ is connected to the output 8 of the selection circuit. The transistor $T_{10}$ is identical to the transistor $T_7$ and the transistor $T_8$ is identical to the transistor $T_9$. The selection circuit operates as follows. The gate-source junctions of the transistors $T_7$, $T_9$, $T_{10}$ and $T_8$ constitute a closed loop so that the sum of the gate-source voltages of these transistors is zero. The gate-source voltages of the transistors $T_8$ and $T_9$ are equal to each other because the same current $I_5$ flows through these identical transistors. Consequently, the gate-source voltages of the transistors $T_7$ and $T_{10}$ are also equal, so that the current in transistor $T_{10}$ is equal to the current $I_3$. Since the current $I_4$ is equal to the sum of the currents $I_3$ and $I_5$ and is therefore larger than the current $I_3$, the smaller of the two currents $I_3$ and $I_4$ appears at the output of the selection circuit. If the current $I_4$ decreases in comparison with the current $I_3$, the current $I_5$ will decrease until it has become zero. The currents $I_3$ and $I_4$ are then equal to each other. The current $I_4$ then flows entirely through the transistor $T_{10}$. In the case of a further decrease of the current $I_4$ relative to the current $I_3$ the output current of the selection circuit will also decrease. Consequently, if the current $I_4$ is also smaller than the current $I_3$ the smaller of the currents $I_3$ and $I_4$ will appear at the output 8 of the selection circuit 5. The control current is applied to the current amplifier via a follower transistor $T_{11}$. The gate electrode of the transistor $T_{11}$ is at a reference voltage $V_R$ and thereby maintains the voltage at the output 8 of the selection circuit constant. The current amplifier comprises a transistor $T_{12}$ between whose gate and source electrodes a current source 16 is arranged. The current for this current source is furnished by a current source 9 which supplies the reference current $I_o$. The drain electrode of the transistor $T_{12}$ supplies the bias current $I_t$ to the common terminal 2. The control current gives rise to a substantial increase of the voltage on the gate electrode of the transistor $T_{12}$ so that the current through this transistor increases strongly. It is to be noted that instead of the current amplifier described here any other current amplifier may be used. It is obvious that in the embodiment shown in FIG. 2 all the PMOS transistors may be replaced by NMOS transistors and vice versa, in which case the polarities of all the current sources should be reversed.

Figure 3:
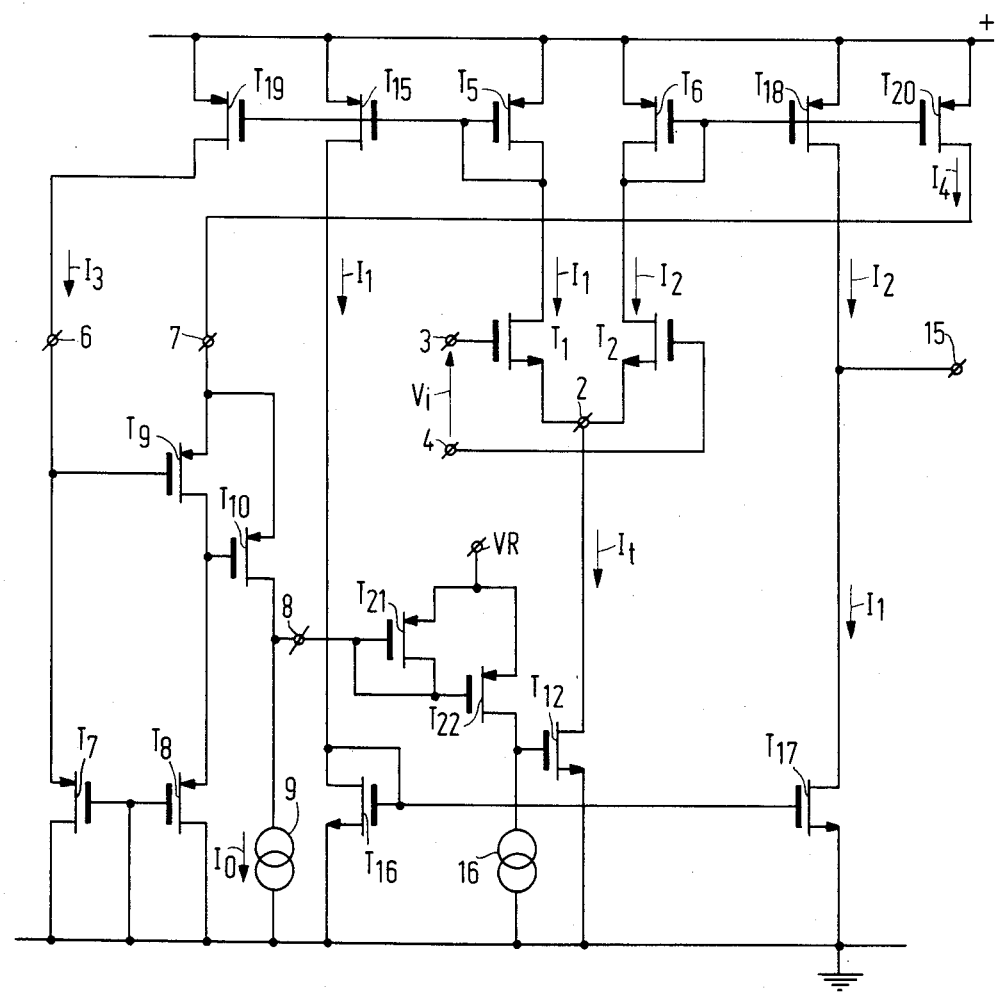
FIG. 3 shows a second embodiment of the invention.

A second embodiment of the invention will now be described with reference to FIG. 3, in which identical parts bear the same reference numerals as in FIG. 2. The current $I_2$ in transistor $T_2$ is fed to the output 15 by means of a current mirror comprising the transistors $T_6$ and $T_{18}$ and the current $I_1$ in the transistor $T_1$ is applied to the output 15 by means of a first current mirror comprising the transistors $T_5$ and $T_{15}$ and a second current mirror comprising the transistors $T_{16}$ and $T_{17}$, so that the difference between the currents in the transistors $T_1$ and $T_2$ appears at the output 15. A transistor $T_{19}$ has its input arranged in parallel with that of the transistor $T_5$ and has such a geometry relative to that of the transistor $T_5$ that the transistor $T_{19}$ carries a current $I_3$ which is equal or proportional to the current $I_1$ in transistor $T_1$. Similarly, a transistor $T_{20}$ has its input arranged in parallel with that of the transistor $T_6$ and carries a current $I_4$ which is equal or proportional to the current $I_2$ in transistor $T_2$. The currents $I_3$ and $T_4$ are applied to the inputs 6 and 7 of the current-selection circuit, which is of the same type as the selection circuit in FIG. 2 but comprises N-MOS instead of P-MOS transistors. Again the control signal is applied to the input of a current amplifier at whose output the bias current $I_t$ for the amplifier arrangement appears. The current amplifier includes a current mirror which is constituted by transistors $T_{21}$ and $T_{22}$ whose source electrodes carry a common reference voltage $V_R$ and which reflects the control current. The output current of the current mirror $T_{21}$, $T_{22}$ is applied to the gate electrode of a transistor $T_{12}$ whose drain electrode supplies the bias current $I_t$ to the common terminal 2.

In this embodiment the P-MOS transistors may again be replaced by N-MOS transistors and vice versa, in which case the polarities of the current sources should be reversed.

The invention is not limited to the embodiments described in the foregoing. Within the scope of the invention many variants, for example, of the selection circuit and the current amplifier, are conceivable to those skilled in the art. All the embodiments show are equipped with MOS transistors, but may alternatively be equipped with bipolar transistors or with a combination of MOS transistors and bipolar transistors. In the case of MOS transistors the arrangement not only functions with MOS transistors operated in the nominal operating range (strong inversion) but also with those operated with very small currents (weak inversion).

What is claimed is:

1. An amplifier arrangement comprising:
 a first transistor and a second transistor of the same conductivity type each of which comprise a control terminal for receiving an input signal, a first main terminal and a second main terminal, the first main terminals being coupled to a common terminal, and
 means for applying to the common terminal a bias current which depends on the input signal, said means comprising a third transistor and a fourth transistor each of which comprise a control terminal and a first and a second main terminal, currents in the third and fourth transistors being related to currents in the first transistor and in the second transistor, respectively,
 characterized in that, the bias current applying means further comprise:
 means for generating a control signal which is a measure of the difference between a reference current and the smaller of the currents in the third transistor and the fourth transistor, and
 negative-feedback means which minimize the control signal from the control-signal generating means by controlling the bias current applied to the common terminal.

2. An amplifier arrangement as claimed in claim 1, characterized in that the control terminals of the third transistor and the fourth transistor are coupled to the control terminals of the first transistor and the second transistor, respectively, and the first main terminals of the third transistor and the fourth transistor are coupled to the common terminal.

3. An amplifier arrangement as claimed in claim 2 wherein the means for generating the control signal comprises a selection circuit for applying the smaller of the currents in the third and fourth transistors to an output and a current source for supplying the reference current to the output, thereby to derive a control signal which is the difference between the currents applied to the output.

4. An amplifier arrangement as claimed in claim 1, characterized in that the first transistor and the second transistor are loaded by a first load transistor and a second load transistor, respectively, of a conductivity type opposite to that of the first transistor and the second transistor, which load transistors each comprise a control terminal, a first main terminal and a second main terminal, the control terminal of the first load transistor being coupled to its second main terminal and to the second main terminal of the first transistor and the control terminal of the second load transistor being coupled to its second main terminal and to the second main terminal of the second transistor, the control terminals of the third transistor and the fourth transistor being coupled to the control terminals of the first load transistor and of the second load transistor, respectively, and the first main terminals of the third transistor and the fourth transistor being coupled to the first main terminals of the first load transistor and of the second load transistor, respectively.

5. An amplifier arrangement as claimed in claim 1 wherein the negative-feedback means comprises a current amplifier having an input connected to an output of the control signal generating means and an output coupled to the common terminal.

6. An amplifier arrangement as claimed in claim 5 wherein the current amplifier comprises, a further transistor having a control terminal, a first main terminal and a second main terminal, means coupling the control terminal to the output of the control signal generating means and the second main terminal to the common terminal, and means coupling a current source between the control terminal and the first main terminal of the further transistor.

7. An amplifier arrangement as claimed in claim 1, characterized in that the means for generating the control signal comprise a selection circuit for applying the smaller of the currents in the third transistor and the fourth transistor to an output and a current source for supplying the reference current to the output, the control signal being derived from the difference between the currents applied to the output.

8. An amplifier arrangement as claimed in claim 7, characterized in that the selection circuit comprises a fifth transistor, a sixth transistor, a seventh transistor and an eighth transistor which each comprise a control terminal, a first main terminal and a second main terminal, the fifth transistor and the sixth transistor being connected in series and having their control terminals connected to the control terminal and the first main terminal of the seventh transistor, respectively, seventh transistor means coupling said first main terminal to the second main terminal of the third transistor, the control terminal and the first main terminal of the eighth transistor being connected to the second main terminal and the first main terminal of the sixth transistor, respectively, the sixth transistor first main terminal also being coupled to the second main terminal of the fourth transistor, and the second main terminal of the eigth transistor being connected to the output of the selection circuit.

9. An amplifier arrangement as claimed in claim 8, characterized in that the negative-feedback means comprise a current amplifier having an input connected to the output of the selection circuit and an output coupled to the common terminal.

10. An amplifier arrangement as claimed in claim 9, characterized in that the current amplifier comprises a ninth transistor having a control terminal, a first main terminal and a second main terminal, the control terminal being coupled to the output of the selection circuit, the second main terminal being coupled to the common terminal, and means coupling a current source between the control terminal of the ninth transistor and the first main terminal.

11. An amplifier circuit providing a signal-dependent bias current comprising:
signal input terminals,
first and second transistors each having a control electrode coupled to an input terminal and a first main electrode coupled to a common terminal of the amplifier circuit,
means including thrid and fourth transistors for applying to the common terminal a bias current dependent upon an input signal, said third and fourth transistors being connected in the amplifier circuit so as to pass third and fourth currents, respectively, that are proportional to first and second currents passed by the first and second transistors, respectively,
a source of reference current,
said bias current applying means further comprising:
means coupled to the third and fourth transistors for deriving a control signal determined by the difference between said reference current and the smaller of the currents in the third and fourth transistors, and
a negative feedback circuit responsive to the control signal and coupled to said common terminal to control the bias current thereat as a function of the input signal and in a manner so as to minimize the control signal by varying the value of the smaller one of the currents in the third and fourth transistors.

12. An amplifier circuit as claimed in claim 11 wherein the third and fourth transistors have control electrodes coupled to the input terminals and each have a main electrode coupled to said common terminal.

13. An amplifier circuit as claimed in claim 12 further comprising:
a fifth transistor of opposite conductivity type to the first transistor connected in series therewith between the common terminal and a terminal of a source of DC supply voltage, said fifth transistor having a control electrode connected to a main electrode thereof that is connected to a main electrode of the first transistor, and
a sixth transistor of opposite conductivity type to the second transistor connected in series therewith between the common terminal and said terminal of the source of DC supply voltage, said sixth transistor having a control electrode connected to the control electrode of the fifth transistor.

14. An amplifier circuit as claimed in claim 11 wherein said control signal deriving means comprise:
a selection circuit having first and second input terminals coupled to respective main electrodes of the third and fourth transistors and an output terminal, said selection circuit including means for applying the smaller of the currents in the third and fourth transistors to said output terminal, and
means for coupling said reference current source to said output terminal so as to derive said control signal at said output terminal.

15. An amplifier circuit as claimed in claim 14 wherein the negative feedback circuit comprises:
a current amplifier having an input coupled to said output terminal of the selection circuit and an output coupled to the common terminal so as to vary the bias current in a sense that tends to make the smaller one of the third and fourth currents equal to the reference current.

* * * * *